(12) United States Patent
Correale, Jr. et al.

(10) Patent No.: US 6,192,486 B1
(45) Date of Patent: Feb. 20, 2001

(54) MEMORY DEFECT STEERING CIRCUIT

(75) Inventors: Anthony Correale, Jr., Raleigh; James Norris Dieffenderfer, Apex; William Robert Lee, Apex; Trevor Scott Garner, Apex, all of NC (US)

(73) Assignee: International Business Machines Corporation, Armonk, NY (US)

( * ) Notice: Under 35 U.S.C. 154(b), the term of this patent shall be extended for 0 days.

(21) Appl. No.: 09/133,395

(22) Filed: Aug. 13, 1998

(51) Int. Cl.[7] ........................................... G06F 11/00
(52) U.S. Cl. ........................................ 714/8; 714/25
(58) Field of Search ........................... 714/8, 2, 3, 6, 714/7, 25, 27, 30, 35, 42, 47

(56) References Cited

U.S. PATENT DOCUMENTS

| | | | |
|---|---|---|---|
| 5,065,312 | * 11/1991 | Bruckert et al. | 395/575 |
| 5,289,377 | * 2/1994 | Yokote et al. | 364/424.04 |
| 5,319,766 | * 6/1994 | Thaller et al. | 395/425 |
| 5,361,267 | * 11/1994 | Godiwala et al. | 371/40.1 |
| 5,553,258 | * 9/1996 | Godiwala et al. | 395/403 |
| 5,553,266 | * 9/1996 | Metzger et al. | 395/471 |
| 5,629,950 | * 5/1997 | Godiwala et al. | 371/51.1 |
| 6,073,251 | * 6/2000 | Jewett et al. | 714/7 |

OTHER PUBLICATIONS

Goldman et al., Halt and start control for microprocessor systems, Derwent No. DD 153445A, 1—1, Jan. 1982.*

IBM Technical disclosure Bulletin, Software control of memory scrubbing, TDB, NN911157, 1–2, Dec. 1991.*

* cited by examiner

Primary Examiner—Nadeem Iqbal
(74) Attorney, Agent, or Firm—John D. Flynn

(57) ABSTRACT

The present invention provides a method and system for bypassing defective sections with a memory array of a computer chip. The circuit in accordance with the present invention includes a register for controlling the effective size of the memory array based upon the detection of at least one defective section in the memory array, and a multiplexer for receiving an index address for the memory array and for the mapping of the index address based upon the register means. The circuit in accordance with the present invention does not use fuses to conduct repairs and thus does not require additional area on the chip for such fuses. As such, it eliminates the complications in the manufacturing process related to fuses and redundant cells. The circuit in accordance with the present invention dynamically manipulates the address of the array to bypass the defective regions of the array. Although the present invention results in a reduction in the overall size of the array, and thus may result in performance degradation, it allows for the continued operation of the chip. For an embedded memory, the chip need not be discarded. Importantly, unlike the conventional method, the circuit in accordance with the present invention has the ability to handle defects which are introduced during usage, and defect detection and bypass are initiated each time the computer is initialized. Thus, the circuit in accordance with the present invention has utility subsequent to manufacturing testing. A chip with embedded memory which has the steering circuit of the present invention is thus more reliable than memory chips repaired with conventional methods.

41 Claims, 4 Drawing Sheets

MEMORY DEFECT STEERING CIRCUIT

FIELD OF THE INVENTION

The present invention relates to computer chips with embedded memories and specifically to addressing defects in computer chips with embedded memories.

BACKGROUND OF THE INVENTION

It is a common occurrence for defects to occur in parts of computer memory chips with embedded memories which result in non-functional parts of the memories. Conventionally, redundancy schemes are used to "repair" such defects on stand-alone memories while embedded memories without redundancy schemes are discarded.

Chips with embedded memories contain numerous cells, each cell having the capability of storing a high or a low voltage representing a "1" bit or a "0" bit respectively. The cells are interconnected in a grid with each row of cells commonly referred to as a word line, a set of word lines being a memory array. Each array has a unique multiplexed address which is controlled by an address generator. This structure of a chip with embedded memory is well known in the art and will not be further discussed here.

When a defective memory array is found during manufacturing tests, the conventional redundancy scheme attempts to replace sections of the damaged array with a redundant bit or word line using fuses. The fuses connecting the defective array portion to the functioning portions of the chip are broken while the fuses which would connect the redundant bit or word line are activated. In this way, defective parts of the chip are replaced and repaired.

A problem with the conventional redundancy scheme is that fuses require additional area on the chip. This can be a heavy penalty for conventional chips which are already very dense. In addition, fuses require additional manufacturing processes which increases the process complexity and manufacturing cost.

Another problem is its limited utility to defects found during manufacturing tests. If defects are introduced into memory during use, they cannot be addressed. The computer may suffer a shut-down without advance warning which would cost a user valuable time. This is a particular problem for computers running critical applications.

Therefore, there exists a need for a circuit for addressing memory defects which minimizes additional area on the chip and has utility subsequent to manufacturing testing. The present invention addresses such a need.

SUMMARY OF THE INVENTION

The present invention provides a method and system for bypassing defective sections of a memory array of a computer chip. A circuit in accordance with the present invention includes a register for controlling the effective size of the memory array based upon the detection of at least one defective section in the memory array, and a multiplexer for receiving an index address for the memory array and for the mapping of the index address based upon the register means. The circuit in accordance with the present invention does not use fuses to conduct repairs and thus does not require additional area on the chip for such fuses. As such, it eliminates the complications in the manufacturing process related to redundant cells. The circuit in accordance with the present invention dynamically manipulates the address of the array to bypass the defective regions of the array. Although the present invention results in a reduction in the overall size of the array, and thus may result in performance degradation, it allows for the continued operation of the chip. For an embedded memory, the chip need not be discarded. Importantly, unlike the conventional method, the circuit in accordance with the present invention has the ability to handle defects which are introduced during usage, and defect detection and bypass are initiated each time the computer is initialized. Thus, the present invention has utility subsequent to manufacturing testing. A chip with embedded memory which has the steering circuit of the present invention is thus more reliable than memory chips repaired with conventional methods.

DETAILED DESCRIPTION

The present invention provides an improved method and system for handling defects in chips with embedded memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention addresses defective parts of a memory by "steering" around the defect rather than repairing it. To more particularly describe the features of the present invention, please refer to FIGS. 1 through 7 in conjunction with the discussion below. To understand the steering circuit of the present invention, the structures surrounding the circuit must first be described.

Figure 1:
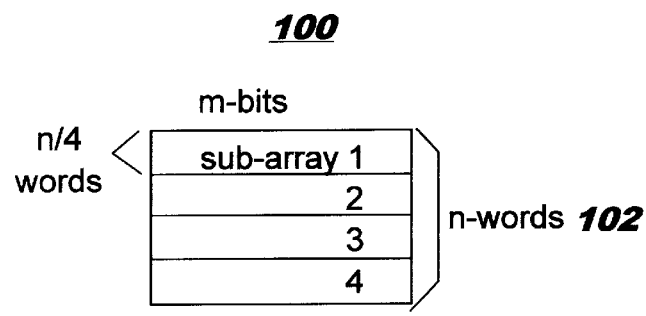
FIG. 1 is a block diagram of a memory array in accordance with the present invention.

FIG. 1 is a block diagram of an array in a chip with embedded memory in accordance with the present invention. Each array 100 may be thought of as containing sub-arrays 102, each being m-bits wide and totaling n-words. A defect in the array 100 may be thought of as being isolated or contained in a given sub-array. Assume in this example, that the array 100 is found to be defective, but in actuality, only sub-array 2 is defective. Under the method and system of the present invention, the array size is reduced by manipulating, or remapping the address of the array, such that sub-array 3 would become the first sub-array of the array. A subsequent access of the reduced array would be steered around sub-arrays 1 and 2 and only access sub-arrays 3 and 4. In the preferred embodiment, the array is reduced by halving the size of the array, and the address of the array is manipulated to point to the upper or the lower two subarrays of the array.

Figure 2:
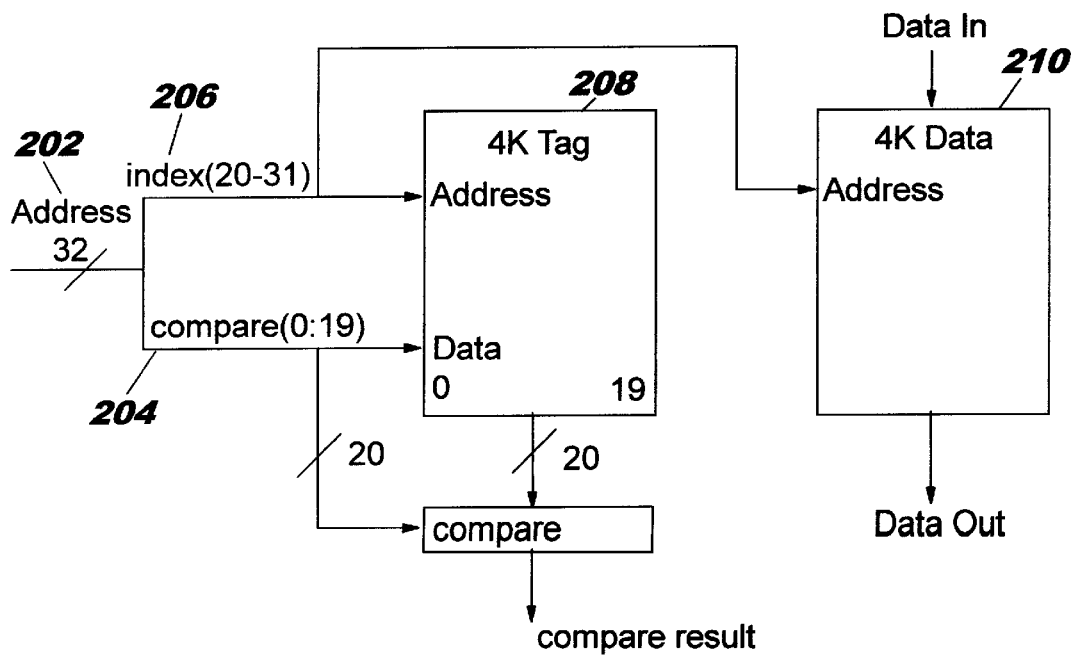
FIG. 2 is a block diagram of a conventional tag and data array scheme.

To remap the address of the array, the method and system of the present invention takes advantage of the conventional tag and data array scheme. This scheme is used to determine if the contents of the on-chip memory is valid. FIG. 2 is a block diagram illustrating this conventional tag and data array scheme. The total address 202 of a memory array is managed by an address generator (not shown). The bits of the total address 202 is partitioned into a tag array which has a compare address 204 and index bits which has an index address 206. In this scheme, the contents of the data array 210 mirrors the contents of an array in the off-chip main storage (not shown). The tag array 208 contains the addresses of the main storage whose contents are mirrored by the data array 210. The index address 206 accesses a specific entry in the tag array 208 and data arrays 210. To determine if the content at the index address 206 is valid, it is compared with the compare address 204. If they match, then the contents of the data cache at the index address 206 is valid and there is a cache hit. If they do not, then there is a cache miss. For a cache miss, the data at the index address 206 of the data array 210 is not valid and must be retrieved from the off-chip main memory. If a memory defect is found in either the tag or data arrays, the memory's sub-array would be deemed unusable.

Once the sub-array containing the defect has been identified, then it is necessary to avoid addressing that sub-array. Since the sub-arrays are addressed by the index bits portion 206 of the total address 202, the index address 206 must be altered so that it does not address the portion of the array which contains the defective sub-array. By not addressing this portion, the overall usable size of the array is effectively reduced and may result in performance degradation. However the defect free portion of the array can still be accessed and used, and the memory chip can continue to operate.

To be able to reduce the size of an array, the chip containing the embedded memory must support a range of array sizes dynamically. In the preferred embodiment of the present invention, this is accomplished through the shifting of the partition of index and compare bits of the total address when the size of the array changes. When the array size is reduced, the number of index bits is also reduced. Thus, when the index address 206 is reduced by n-bits, the bits for the compare address 204 are increased by n-bits in order to maintain the same bit width for the total address 202.

Figure 3:
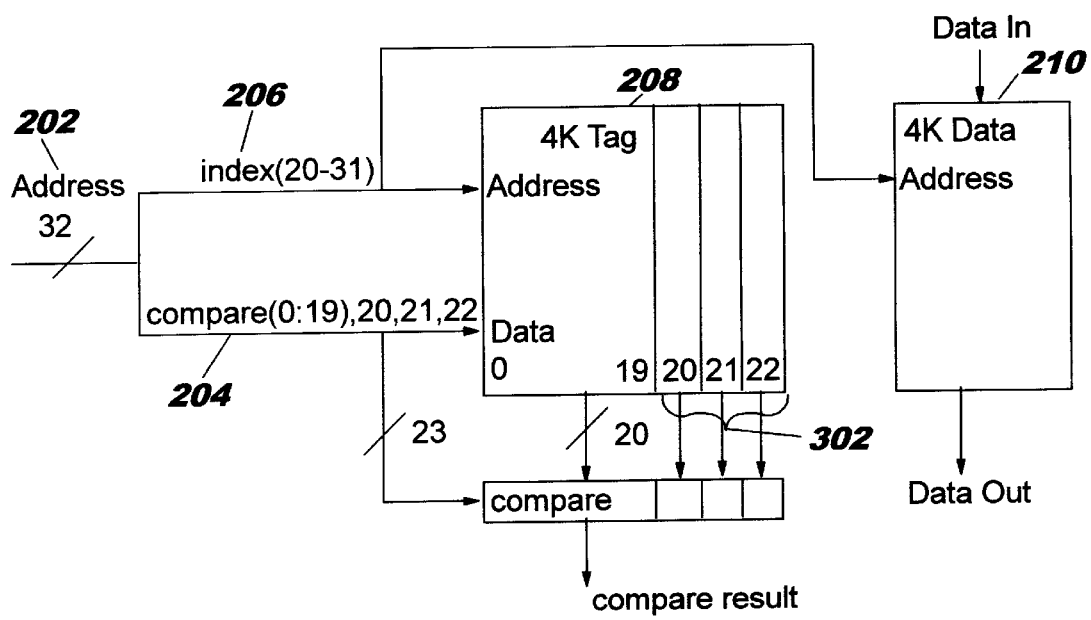
FIG. 3 is a block diagram of a modification of the conventional tag and data array scheme in accordance with the present invention.

FIG. 3 illustrates an example of such partition shifting in accordance with the present invention. Assume the memory is to be structured so that it may support array sizes between ½K to 4K data arrays. To support a data array of 4K, the index address must have 12 bits (20–31) and the compare address would have 20 bits (0–19). If the data array is reduced to 2K, the index address reduces to 11 bits (21–31) while the compare address increases to 21 bits (0–20). If a data array is reduced to ½K, the index address reduces to 9 bits (23–31) while the compare address must increase to 23 bits (0–22). There is an overlap of three compare bits and index bits (20–22). There are therefore three additional bits 302 associated with the tag array width and are thus the overhead for this array. This partition shifting allows the array widths to be programmable and dynamic.

In order to effectively use a subset of the total memory size which results from reducing the size of arrays with defective sub-arrays, the index address 206 of the array must be manipulated. This is accomplished by a steering circuit, or index mapping circuit (IMC), in accordance with the present invention.

Figure 4:
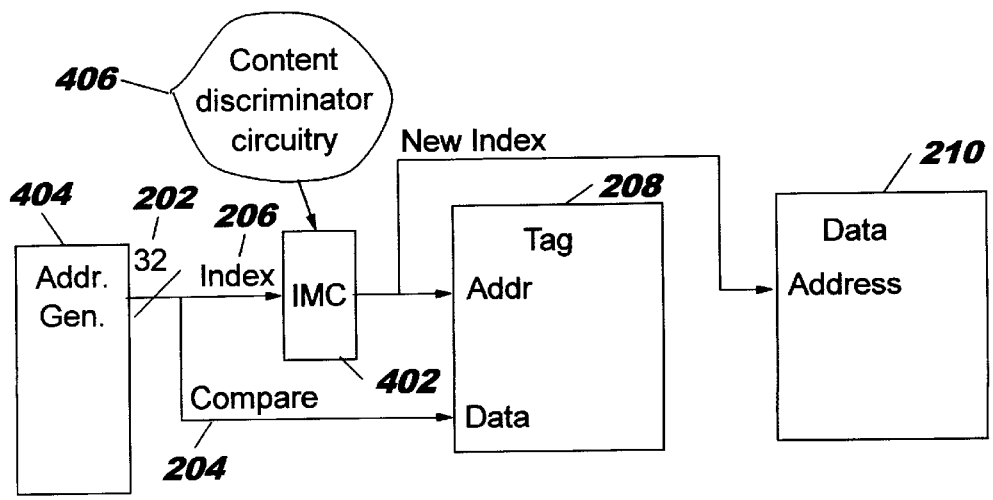
FIG. 4 is a block diagram of a steering circuit in accordance with the present invention.
Figure 5:
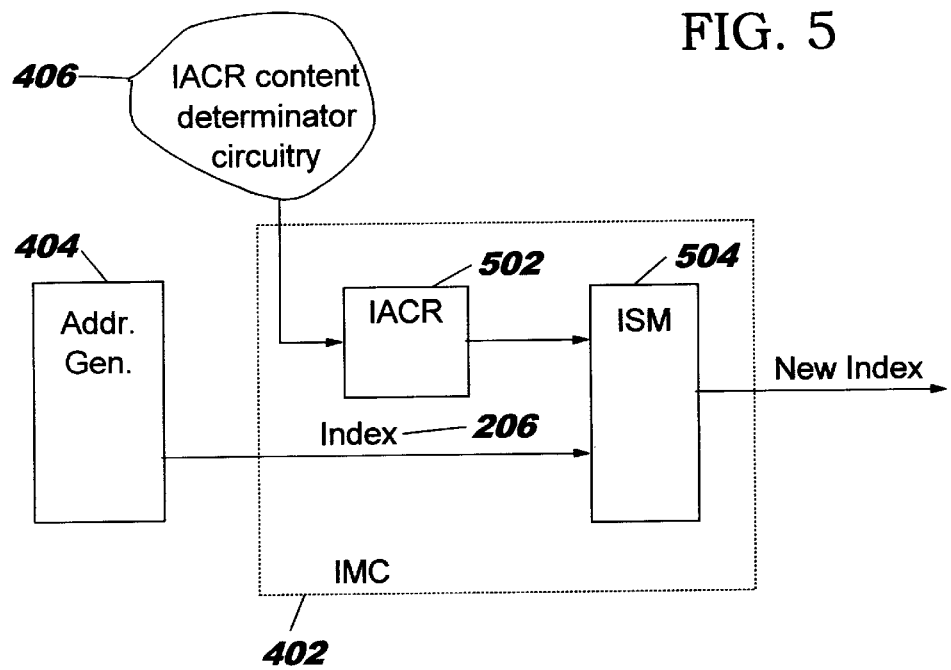
FIG. 5 is a block diagram of the components of the steering circuit in accordance with the present invention.

FIG. 4 illustrates the preferred embodiment of an IMC 402 in accordance with the present invention. The IMC 402 is inserted between the output of the address generator 404 and the inputs of the index address of the tag and data arrays. The attributes related to the location of the defect are loaded into the IMC 402 through a content determinator circuitry 406. Referring now to FIG. 5, the IMC 402 contains at least two components, an index address control register (IACR) 502 and an index steering multiplexer (ISM) 504, with the attributes relating to the location of the defect loaded into the IACR 502 through an IACR content determinator circuitry 406. The IACR 502 contains a plurality of bits or registers with some bits determining the maximum size of the usable array (index manipulation bits) and other bits which will be used to alter the index address 206 to steer around the unusable portions of the array (steering bits). The ISM 504 is a steering multiplexer whose control is determined by the IACR's steering bits. Its data inputs include the original index bits and numerous combinations of IACR index bits concatenated in front of the reduced original index.

Figure 6:
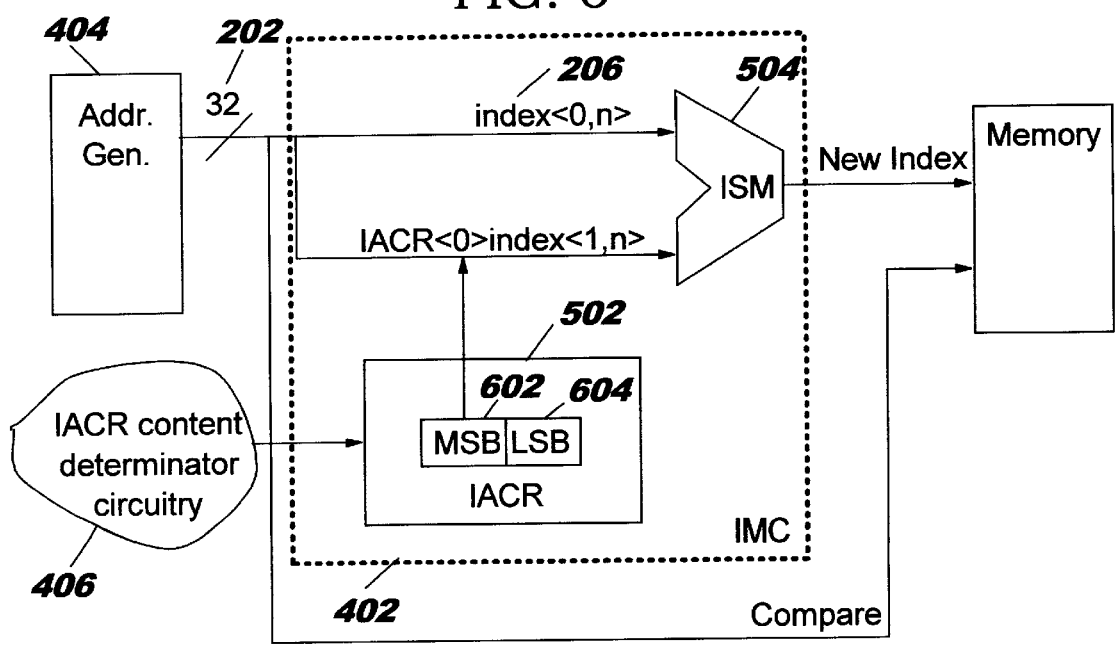
FIG. 6 is a block diagram illustrating the remapping of an array in accordance with the present invention.

FIG. 6 illustrates an example of the manipulation of the index address 206 in accordance with the present invention. In this example, the IACR 502 is a 2-bit register with a most significant bit (MSB) as the index manipulation bit 602 and a least significant bit (LSB) as the steering bit 604. The ISM 504 is a 2 to 1 multiplexer. The IACR content determinator circuitry 406 loads the location of the defect, i.e., the upper or lower half of the array, into the IACR 502. The LSB of the IACR 502 is used to steer or control the ISM 504. If no defect is found in the array, the original index 206 is steered out without changes. If a defect is found, the MSB 602 containing either a '0' or '1' is used to modify the most significant index bit of the index address 206 to point to either the upper or lower half of a memory array, resulting in a new index address. The new index is then steered out.

Although the method and system of the present invention is described with the IACR as a 2-bit register utilizing a LSB and MSB, one of ordinary skill in the art will understand that any bit number or value can be used for the registers without departing from the spirit and scope of the present invention.

The location of the defect may be loaded into the IACR 502 of the present invention using any diagnostic means. In the preferred embodiment, the IACR content determinator circuitry 406 (FIG. 5) is linked with an on-board Array Built-In Self Test ("ABIST") controller. The use of ABIST controllers with memory arrays are well known in the art and will not be further discussed here. With this link, each time the computer is reset or powered up, the ABIST controller determines the presence of any array defects and their location. This information is passed to the IACR content determinator circuitry 406. One important advantage of this preferred embodiment is that the integrity of the memory arrays are diagnosed each time the computer is initialized. The state of the IACR 502 is then updated. This not only can be done during manufacturing tests but also while the computer is operating in the field. This type of monitoring of the array integrity allows for enhanced reliability of the memory within a chip. This is especially important when a computer runs critical applications. In addition, application routines could be written to take advantage of the present invention by monitoring the IACR 502 content and alert the user of a problem prior to failure.

Another advantage of the preferred embodiment stems from the ABIST engine's ability to report failures of the memory on a chip at the time of manufacturing tests. The manufacturing tests can be tailored to support a sorting of chips where partially good on-chip embedded memory can be identified and marked as a reduced function/performance product. Since the ABIST engine in conjunction with the IACR content determinator circuit 406 will update/load the IACR 502, the content of the IACR 502 can be read and deterministic programs can be used to sort the product. This allows a manufacturer to sell products which otherwise would be discarded.

In a second embodiment of the present invention, the location of the defect or subarray(s) to be bypassed, is loaded into the IACR 502 by way of software control where the registers are loaded directly through an instruction or other means. A third embodiment loads the location into the IACR 502 by way of a level sensitivity scan design chain where the values are scanned into the IACR 502.

The second and third embodiments of the present invention can be used to assess the performance impacts at the system level ("insitu") associated with using less memory. For example, a software developer may determine how much memory its software will require in order to run efficiently by testing the performance of the software under different memory sizes using the second and third embodiments of the present invention.

Although the method and system of the present invention has been described in the context of one memory array, one of ordinary skill in the art will understand that the same concepts may be applied to multiple arrays on the same chip without departing from the spirit and scope of the present invention.

Figure 7:
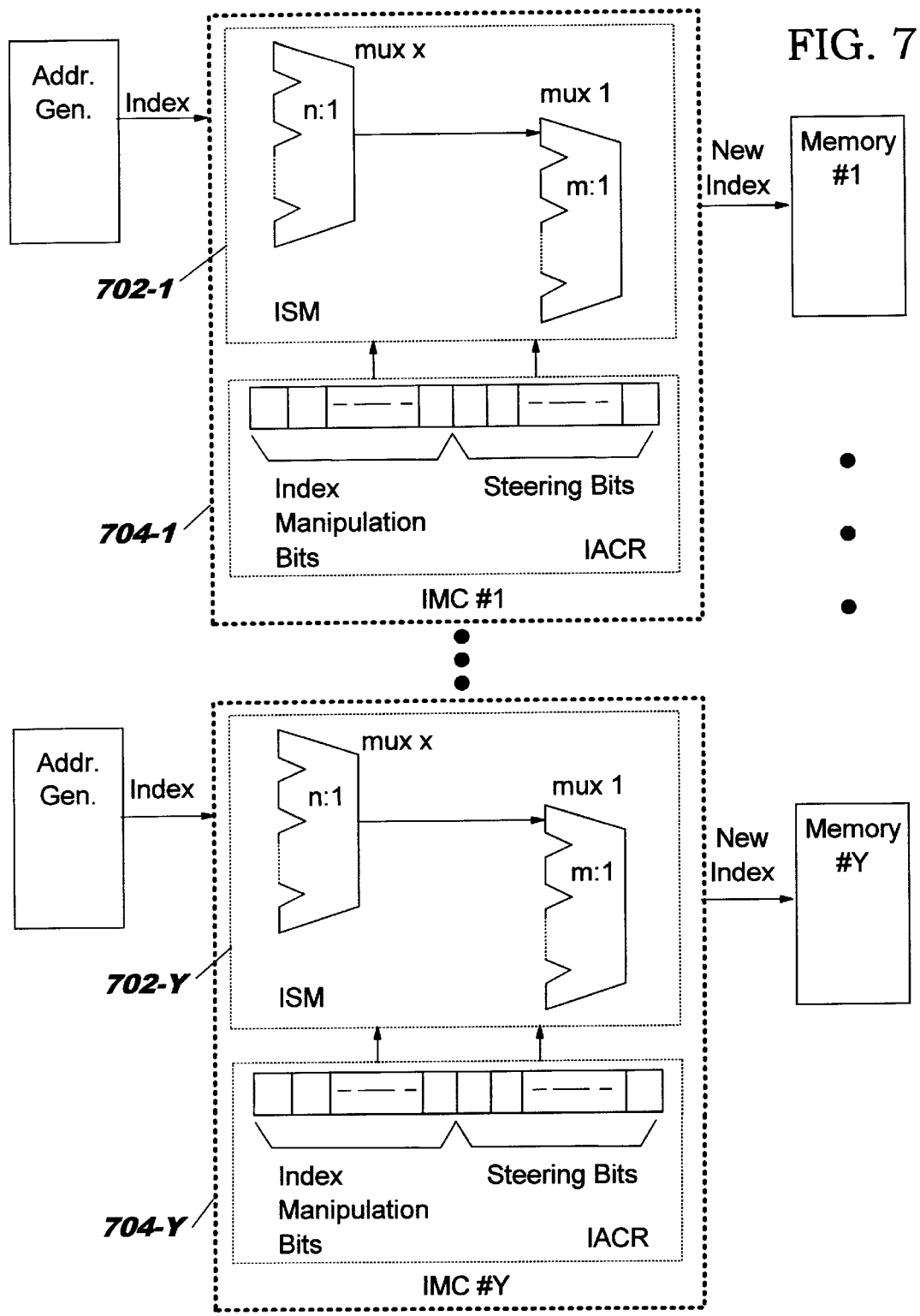
FIG. 7 is a block diagram of a steering circuit with hierarchical ISMs and multiple arrays in accordance with the present invention.

FIG. 7 illustrates another embodiment of the present invention as implemented with a hierarchical ISM and with multiple arrays. With this embodiment, each array has an IMC (704-1 through 704-Y). Multiple IACR content discriminator circuitry (not shown) or a single more complex circuit may be used. Also, the ISMs (702-1 through 702-Y) can be organized hierarchically (multi-staged) or organized as a single-staged register. One of ordinary skill in the art will understand that the ISM can be organized in a number of different ways without departing from the spirit and scope of the present invention.

An improved method and system for handling defects in computer chips with embedded memories has been disclosed. A circuit in accordance with the present invention does not use fuses to conduct repairs and thus does not require additional area on the chip. As such, it eliminates the complications in the manufacturing process related to fuses and redundant cells. The circuit in accordance with the present invention dynamically manipulates the address of the array to bypass the defective regions of the array. Although the circuit in accordance with the present invention results in a reduction in the overall size of the array, and thus may result in performance degradation, it allows for the continued operation of the chip. For an embedded memory, the chip need not be discarded. Importantly, unlike the conventional method, the circuit in accordance with the present invention has the ability to handle defects which are introduced during usage, and defects are handled each time the computer is initialized. Thus, the circuit in accordance with the present invention has utility subsequent to manufacturing testing. A chip with embedded memory which has the steering circuit of the present invention is thus more reliable than memory chips repaired with conventional methods.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit for bypassing defective sections within a memory array comprising:

register means for controlling the effective size of the memory array based upon the detection of at least one defective section in the memory array; and multiplexer means for receiving an index address for the memory array and for the mapping of the index address based upon the register means.

2. The circuit of claim 1, wherein the register means comprises an index address control register.

3. The circuit of claim 2, wherein the index address control register comprises:

at least one steering bit; and at least one index manipulation bit.

4. The circuit of claim 3, wherein the at least one steering bit is a least significant bit.

5. The circuit of claim 3, wherein the at least one index manipulation bit is a most significant bit.

6. The circuit of claim 1, wherein the multiplexer means comprises an index steering multiplexer.

7. The circuit of claim 6, wherein the index steering multiplexer comprises:

means for not reducing a size of the memory array if at least one steering bit of the register means indicates that no defective sections were detected in the memory array; and means for reducing the size of the memory array based upon at least one index manipulation bit if the at least one steering bit indicates that defective sections were detected in the memory array, resulting in a new index address.

8. The circuit of claim 7 wherein the reducing means comprises a means for shifting a partition between the index address and a compare address, wherein the index address and the compare address comprise a total address, wherein a bit width of the total address remains constant.

9. The circuit of claim 1 wherein the circuit further comprises a means for loading a location of the defective section of the memory array into the register means.

10. The circuit of claim 9 wherein the loading means comprises an ABIST engine.

11. The circuit of claim 9 wherein the loading means comprises computer instructions.

12. The circuit of claim 9 wherein the loading means comprises a level sensitive scan design.

13. A circuit for bypassing defective sections within a memory array comprising:

an index address control register for controlling the effective size of the memory array based upon the detection of at least one defective section in the memory array; and an index steering multiplexer for receiving an index address for the memory array and for the mapping of the index address based upon the register means.

14. The circuit of claim 13, wherein the index address control register comprises:

at least one steering bit; and at least one index manipulation bit.

15. The circuit of claim 14, wherein the at least one steering bit is a least significant bit.

16. The circuit of claim 14, wherein the at least one index manipulation bit is a most significant bit.

17. The circuit of claim 13, wherein the index steering multiplexer comprises:
   means for not reducing a size of the memory array if at least one steering bit of the index address control register indicates that no defective sections were detected in the memory array; and
   means for reducing the size of the memory array based upon at least one index manipulation bit if the at least one steering bit indicates that defective sections were detected in the memory array, resulting in a new index address.

18. The circuit of claim 17, wherein the reducing means comprises a means for shifting a partition between the index address and a compare address, wherein the index address and the compare address comprise a total address, wherein a bit width of the total address remains constant.

19. The circuit of claim 13, wherein the circuit further comprises a means for loading a location of the defective section of the memory array into the register means.

20. The circuit of claim 19, wherein the loading means comprises an ABIST engine.

21. The circuit of claim 19, wherein the loading means comprises computer instructions.

22. The circuit of claim 19, wherein the loading means comprises a level sensitive scan design.

23. A circuit for bypassing defective sections within a memory array comprising:
   register means for controlling the effective size of the memory array based upon the detection of at least one defective section in the memory array, wherein the register means comprises an index address control register, wherein the index address control register comprises at least one steering bit and at least one index manipulation bit; and
   multiplexer means for receiving an index address for the memory array and for the mapping of the index address based upon the register means, wherein the multiplexer means comprises an index steering multiplexer, wherein the index steering multiplexer comprises
   means for reducing the size of the memory array if the at least one steering bit indicate that defective sections were detected in the memory array, and
   means for reducing the size of the memory array based upon the at least one index manipulation bit if the at least one steering bit indicate that defective sections were detected in the memory array.

24. The circuit of claim 23, wherein the at least one steering bit is a least significant bit.

25. The circuit of claim 23, wherein the at least one index manipulation bit is a most significant bit.

26. The circuit of claim 23, wherein the reducing means comprises a means for shifting a partition between the index address and a compare address, wherein the index address and the compare address comprise a total address, wherein a bit width of the total address remains constant.

27. The circuit of claim 23, wherein the circuit further comprises a means for loading a location of the defective section of the memory array into the register means.

28. The circuit of claim 27, wherein the loading means comprises an ABIST engine.

29. The circuit of claim 27, wherein the loading means comprises computer instructions.

30. The circuit of claim 27, wherein the loading means comprises a level sensitive scan design.

31. A method for bypassing defective sections within a memory array, comprising the steps of:
   (a) controlling the effective size of the memory array, using a control register, based upon the detection of at least one defective section in the memory array; and
   (b) receiving an index address for the memory array into a multiplexer and mapping the index address based upon the control register.

32. The method in claim 31, wherein the control register is an index address control register comprising:
   at least one steering bit; and
   at least one index manipulation bit.

33. The method in claim 32, wherein the at least one steering bit is a least significant bit.

34. The method in claim 32, wherein the at least one index manipulation bit is a most significant bit.

35. The method in claim 31, wherein the multiplexer is an index steering multiplexer.

36. The method in claim 31, wherein the receiving step (b) further comprises the steps of:
   (b1) not reducing a size of the memory array if at least one steering bit of an index address control register indicates that no defective sections were detected in the memory array; and
   (b2) reducing the size of the memory array based upon at least one index manipulation bit if the at least one steering bit indicates that defective sections were detected in the memory array, resulting in a new index address.

37. The method in claim 36, wherein the reducing step (b2) further comprises the step of:
   (b2i) shifting a partition between the index address and a compare address, wherein the index address and the compare address comprise a total address, wherein a bit width of the total address remains constant.

38. The method in claim 31, further comprising the step of:
   (c) loading a location of the defective section of the memory array into the control register.

39. The method of claim 38, wherein the loading step (c) is performed by an ABIST engine.

40. The method of claim 38, wherein the loading step (c) is performed by computer instructions.

41. The method of claim 38, wherein the loading step (c) is performed by a level sensitive scan design.

* * * * *